(12) United States Patent
Ohlsson et al.

(10) Patent No.: US 12,222,165 B2
(45) Date of Patent: Feb. 11, 2025

(54) APPARATUS FOR TRANSFERRING HEAT FROM A HEAT SOURCE TO AIR

(71) Applicant: Huawei Technologies Co., Ltd., Shenzhen (CN)

(72) Inventors: Fredrik Ohlsson, Kista (SE); Vadim Tsoi, Kista (SE)

(73) Assignee: Huawei Technologies Co., Ltd., Shenzhen (CN)

( * ) Notice: Subject to any disclaimer, the term of this patent is extended or adjusted under 35 U.S.C. 154(b) by 247 days.

(21) Appl. No.: 17/831,230

(22) Filed: Jun. 2, 2022

(65) Prior Publication Data
US 2022/0290926 A1 Sep. 15, 2022

Related U.S. Application Data

(63) Continuation of application No. PCT/EP2019/083324, filed on Dec. 2, 2019.

(51) Int. Cl.
*F28D 15/02* (2006.01)
*H05K 7/20* (2006.01)

(52) U.S. Cl.
CPC ..... *F28D 15/0233* (2013.01); *F28D 15/0275* (2013.01); *H05K 7/20336* (2013.01)

(58) Field of Classification Search
CPC . F28D 15/02; F28D 15/0266; H05K 7/20336; H01L 23/427
See application file for complete search history.

(56) References Cited

U.S. PATENT DOCUMENTS

| | | | |
|---|---|---|---|
| 6,462,949 B1 | 10/2002 | Parish, IV et al. | |
| 2002/0160742 A1* | 10/2002 | Hasegawa | H04B 1/036 455/128 |
| 2002/0166655 A1* | 11/2002 | Sugito | F28D 15/0233 165/104.21 |
| 2003/0079864 A1 | 5/2003 | Ohara | |
| 2004/0173342 A1 | 9/2004 | Sugito et al. | |
| 2013/0340978 A1 | 12/2013 | Agostini et al. | |

FOREIGN PATENT DOCUMENTS

JP 2005150489 A * 6/2005

* cited by examiner

*Primary Examiner* — Eric S Ruppert
(74) *Attorney, Agent, or Firm* — Leydig, Voit & Mayer, Ltd.

(57) ABSTRACT

An apparatus for transferring heat from a heat source to air while the apparatus is connected to the heat source is provided. The apparatus has a heat sink comprising a heat sink base and a plurality of primary fins connected to the heat sink base. The apparatus includes a heat sink front. The heat sink base is configured to be thermally coupled to the heat source. Each primary fin of the plurality of primary fins has one or more conduits. The heat sink base includes a first chamber. The first chamber and the conduits together form a common space sealed off from the air surrounding the apparatus. The first chamber and the conduits together enclose a heat-carrying fluid in the common space formed by the first chamber and the conduits. A network access node for a wireless communication system is provided. The network access node comprises the above-described apparatus.

16 Claims, 20 Drawing Sheets

APPARATUS FOR TRANSFERRING HEAT FROM A HEAT SOURCE TO AIR

CROSS-REFERENCE TO RELATED APPLICATIONS

This application is a continuation of International Application No. PCT/EP2019/083324, filed on Dec. 2, 2019, the disclosure of which is hereby incorporated by reference in its entirety.

FIELD

The disclosure relates to an apparatus for transferring heat from a heat source to air when the apparatus is connected to the heat source, wherein the apparatus comprises a heat sink which comprises a heat sink base and a plurality of primary fins connected to the heat sink base. Further, the disclosure relates to a network access node for a wireless communication system, wherein the network access node comprises an apparatus of the above-mentioned sort. The network access node may comprise a base station.

BACKGROUND

Heat sinks are used in various fields of technology, for example in the field of telecommunications, where a heat sink may be installed in a network access node, for example a base station unit or radio unit, to provide cooling. Cooling in a network access node is often needed because of the heat sources in the network access node, for example a transmitter, a printed circuit board, optical transducers, power amplifiers etc. In general, a heat sink has a plurality of primary fins. Some cooling techniques are not well suited for cooling a network access node. Especially, some techniques are not efficient enough.

SUMMARY

Embodiments of this disclosure provide a solution which mitigates or solves the drawbacks and problems of conventional solutions.

The above-mentioned and further drawbacks and problems are solved by the subject matter of the independent claim. Further advantageous embodiments of the disclosure can be found in the dependent claims.

According to a first aspect of the disclosure, the above-mentioned and other drawbacks and problems are achieved with an apparatus for transferring heat from a heat source to air when the apparatus is connected to the heat source. The apparatus comprises a heat sink comprising a heat sink base and a plurality of primary fins connected to the heat sink base. The apparatus comprises a heat sink front. The heat sink base is configured to be thermally coupled to the heat source. Each primary fin of the plurality of primary fins comprises one or more conduits. The heat sink base comprises a first chamber, wherein the first chamber and the conduits together form a common space sealed off from the ambient air surrounding the apparatus. The first chamber and the conduits together enclose a heat-carrying fluid in the common space formed by the first chamber and the conduits.

In the common space of the apparatus according to the first aspect, the heat-carrying fluid can move freely driven by the difference in temperature in different parts of the heat sink. An advantage of the apparatus according to the first aspect is that the heat-carrying fluid essentially can travel or move in a "three-dimensional space". In the first chamber of the heat sink base, the fluid can essentially travel in a two-dimensional space essentially in a "plane" defined by an x-axis and a y-axis, or an x-vector and y-vector, and in each conduit the fluid can travel in the direction of the z-axis or z-vector, wherein the x-, y- and z-axis form an angle of substantially 90 degrees to one another. Hereby, the fluid can travel in the heat sink in an efficient manner and carry heat away from heat source and the from the heat sink base in an improved manner. The heat source may be an electric or electronic component for example located on a printed circuit board, PCB. Further examples of a heat source are given in the detailed description herein below. By means of the "three-dimensional" common space, a "three-dimensional space"-movement of the fluid is attained which allows the heated and/or evaporated fluid to move to essentially any part of the common space, which results in an improved heat spreading or heat transfer. By means of this "three-dimensional space"-movement of the fluid, the heat in the heat sink can be transferred in a more efficient manner, whereby the heat transfer efficiency or thermal conductivity of the heat sink is efficiently improved. Hereby, the heat source, for example an electric or electronic component, and/or the area around the heat source are/is efficiently cooled. A result of the improved heat transfer efficiency or thermal conductivity of the heat sink is that the volume and weight of the heat sink can be reduced, which is an advantage for a network access node for a wireless communication system, for example a base station. Consequently, the base station can be produced in a more efficient manner and take up less space when installed. The temperatures of typical electric or electronic components of a typical base station can be decreased significantly, for example approximately by 5 to 30° C. It is to be understood that a fluid can be a liquid or a vapour or a mixture thereof.

Each primary fin of the plurality of primary fins may be connected to the heat sink base by being attached to the heat sink base or by being formed integrally with the heat sink base.

In an implementation of an apparatus according to the first aspect, the first chamber and the conduits form the common space such that heat is carried by the fluid from the first chamber to the conduits. An advantage with this implementation is that heat can be transferred in an efficient manner, whereby the heat transfer efficiency or thermal conductivity and the cooling efficiency of the heat sink are improved.

In an implementation of an apparatus according to the first aspect, the first chamber and the conduits form the common space such that heat is carried by the fluid from the first chamber to the heat sink front via the conduits. An advantage with this implementation is that heat can be transferred in an efficient manner, whereby the heat transfer efficiency and the cooling efficiency of the heat sink are improved.

In an implementation of an apparatus according to the first aspect, the heat sink base defines a hot interface, wherein the apparatus at the hot interface is configured to turn a liquid of the fluid inside the common space into a vapour by allowing the liquid to absorb heat from the hot interface. An advantage with this implementation is that heat can be transferred in an efficient manner, whereby the heat transfer efficiency and the cooling efficiency of the heat sink are improved.

In an implementation of an apparatus according to the first aspect, the first chamber has a shell, wherein the apparatus at the hot interface is configured to turn a liquid of the fluid inside the common space into a vapour by allowing the liquid to absorb heat from the shell of the first chamber. An advantage with this implementation is that heat can be transferred in an efficient manner, whereby the heat transfer efficiency of the heat sink is improved.

In an implementation of an apparatus according to the first aspect, the first chamber and the conduits form the common space such that a vapour of the fluid travels from the first chamber of the heat sink base, along the conduits and toward the heat sink front. An advantage with this implementation is that that heat can be transferred in an efficient manner and the thermal conductivity of the heat sink is improved.

In an implementation of an apparatus according to the first aspect, each primary fin of the plurality of primary fins has a surface for condensing a vapour of the fluid inside the common space into a liquid. An advantage with this implementation is that the fluid is circulated in the common space in an efficient manner, whereby the thermal conductivity of the heat sink is further improved.

In an implementation of an apparatus according to the first aspect, the first chamber and the conduits form the common space such that a liquid of the fluid is returned back to the first chamber by way of any one of capillary action, gravity and a pressure difference. An advantage with this implementation is that the fluid is circulated in the common space in an efficient manner, whereby the thermal conductivity of the heat sink is further improved.

In an implementation of an apparatus according to the first aspect, the heat sink front comprises a second chamber. The first chamber, the conduits and the second chamber together form a common space sealed off from the ambient air surrounding the apparatus. The first chamber, the conduits and the second chamber together enclose a heat-carrying fluid in the common space formed by the first chamber, the conduits and the second chamber. An advantage with this implementation is that that heat can be transferred in an efficient manner and transferred to air in an efficient way, whereby the heat transfer efficiency of the heat sink is improved.

In an implementation of an apparatus according to the first aspect, the first chamber, the conduits and the second chamber form the common space such that a vapour of the fluid travels from the first chamber to the second chamber via the conduits. An advantage with this implementation is that the fluid is circulated in the common space in an efficient manner, whereby the thermal conductivity of the heat sink is further improved.

In an implementation of an apparatus according to the first aspect, the heat sink front has a surface for condensing a vapour of the fluid inside the common space into a liquid. An advantage with this implementation is that heat can be transferred in an efficient manner and transferred to air in an efficient way, whereby the heat transfer efficiency of the heat sink is improved.

In an implementation of an apparatus according to the first aspect, the heat sink base comprises a third chamber. The first chamber, the conduits and the third chamber together form a common space sealed off from the ambient air surrounding the apparatus. The first chamber, the conduits and the third chamber together enclose a heat-carrying fluid in the common space formed by the first chamber, the conduits and the third chamber, wherein at the heat sink base the conduits of each primary fin of a first group of the plurality of primary fins are fluidly connected to the first chamber but sealed off from the third chamber, and wherein at the heat sink base the conduits of each primary fin of a second group of the plurality of primary fins are fluidly connected to the third chamber but sealed off from the first chamber. An advantage with this implementation is that the heat sink base and the conduits on the heat sink base side are divided into modules or sections, whereby the heat transfer from the heat sink base can be tailored in view of the number of heat sources and the positions of the heat sources in relation to the heat sink base. Thus, heat can be transferred in an efficient manner, whereby the heat transfer efficiency of the heat sink is improved.

In an implementation of an apparatus according to the first aspect, the heat sink front comprises a second chamber and a fourth chamber, wherein the heat sink base comprises a third chamber. The first chamber, the conduits of each primary fin of a first group of the plurality of primary fins and the second chamber together form a common space sealed off from the ambient air surrounding the apparatus, wherein the first chamber, the conduits of each primary fin of the first group of the plurality of primary fins and the second chamber together enclose a heat-carrying fluid in the common space formed by the first chamber, the conduits of each primary fin of the first group of the plurality of primary fins and the second chamber. The third chamber, the conduits of each primary fin of a second group of the plurality of primary fins and the fourth chamber together form a common space sealed off from the ambient air surrounding the apparatus, wherein the third chamber, the conduits of each primary fin of the second group of the plurality of primary fins and the fourth chamber together enclose a heat-carrying fluid in the common space formed by the third chamber, the conduits of each primary fin of the second group of the plurality of primary fins and the fourth chamber. At the heat sink base the conduits of each primary fin of the first group of the plurality of primary fins are fluidly connected to the first chamber but sealed off from the third chamber, wherein at the heat sink base the conduits of each primary fin of the second group of the plurality of primary fins are fluidly connected to the third chamber but sealed off from the first chamber. At the heat sink front the conduits of each primary fin of the first group of the plurality of primary fins are fluidly connected to the second chamber but sealed off from the fourth chamber, wherein at the heat sink front the conduits of each primary fin of the second group of the plurality of primary fins are fluidly connected to the fourth chamber but sealed off from the second chamber. An advantage with this implementation is that the heat sink base, the heat sink front and the conduits on both the heat sink base side and the heat sink front side are divided into modules or sections, whereby the heat transfer from the heat sink base can be tailored in view of the strength of each heat source and the positions of the heat sources in relation to the heat sink base. Thus, heat can be transferred in an efficient manner, whereby the heat transfer efficiency of the heat sink is improved.

In an implementation of an apparatus according to the first aspect, at the heat sink front the conduits of a first primary fin of the plurality of primary fins are sealed off from the conduits of a second primary fin of the plurality of primary fins. An advantage with this implementation is that the heat transfer from the heat sink base can be tailored in view of the strength of each heat source and in view of the positions of the heat sources in relation to individual primary fins, whereby an efficient heat transfer is provided. Further, an advantage with this implementation is that a more compact structure is provided since the front can be made thinner because of the exclusion of any chamber in the heat sink front. Further, the compact structure provided requires a smaller volume of heat-carrying fluid in relation to a structure with a chamber in the heat sink front. Consequently, since the heat-carrying fluid is associated with costs, the compact structure makes the apparatus less expensive.

In an implementation of an apparatus according to the first aspect, each primary fin of the plurality of primary fins extends from the heat sink base to the heat sink front. An advantage with this implementation is that an efficient heat transfer is provided.

In an implementation of an apparatus according to the first aspect, the heat sink front is opposite the heat sink base. An advantage with this implementation is that an efficient heat transfer is provided.

In an implementation of an apparatus according to the first aspect, each primary fin of the plurality of primary fins is connected to the heat sink front. Each primary fin of the plurality of primary fins may be connected to the heat sink front by being attached to the heat sink front or by being formed integrally with the heat sink front. An advantage with this implementation is that an efficient heat transfer is provided.

In an implementation of an apparatus according to the first aspect, the apparatus comprises a plurality of secondary fins, wherein each secondary fin of the plurality of secondary fins is connected to a primary fin of the plurality of primary fins. An advantage with this implementation is that the heat transfer efficiency of the heat sink is further improved.

According to a second aspect of the disclosure, the above-mentioned and other drawbacks and problems are achieved with a network access node for a wireless communication system, wherein the network access node comprises an apparatus according to any one of the claims 1 to 14 or according to any of the above- or below-mentioned embodiments or implementations of the apparatus. Advantages of the network access node correspond to the advantages of the apparatus and its implementations or embodiments mentioned above or below. The network access node may comprise a base station.

Further applications and advantages of the implementations or embodiments of the disclosure will be apparent from the following detailed description.

BRIEF DESCRIPTION OF THE DRAWINGS

The appended drawings clarify and explain different embodiments of the disclosure, in which.

DETAILED DESCRIPTION

Figure 2:
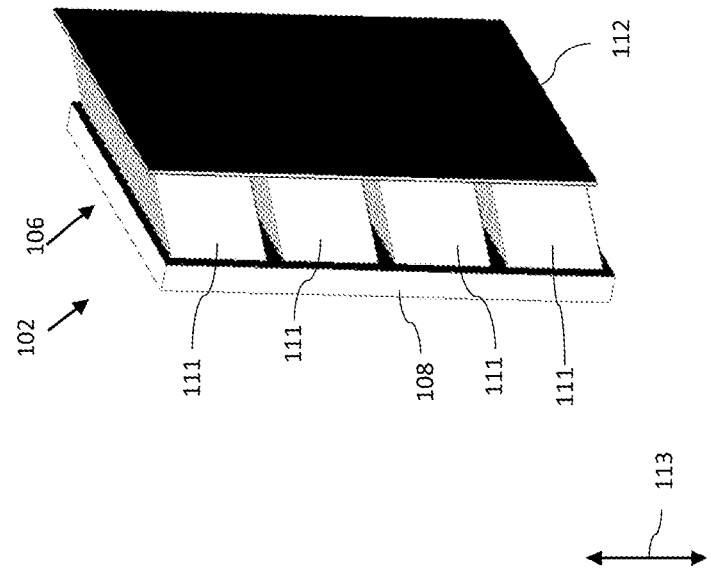
FIG. 2 is a schematic perspective view of the first embodiment of the apparatus shown in FIG. 1 from a different perspective.
Figure 1:
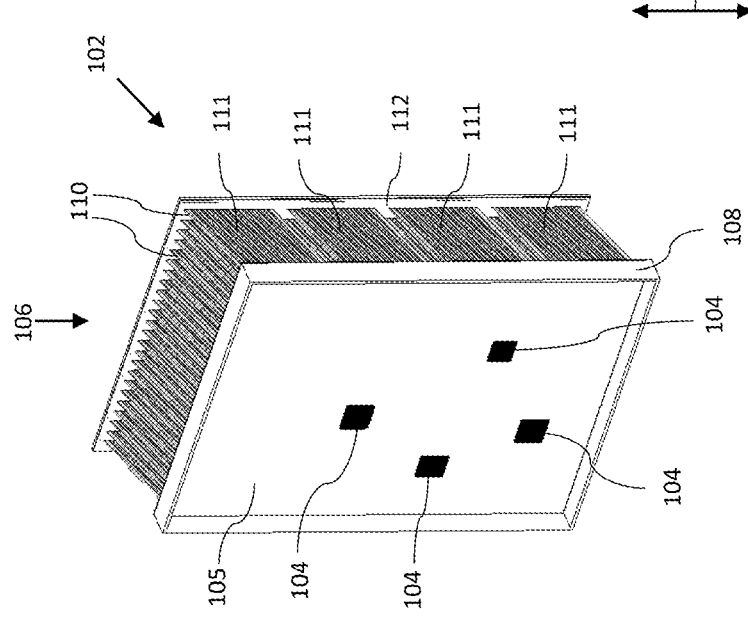
FIG. 1 is a schematic perspective view of a first embodiment of the apparatus according to the first aspect of the disclosure.

With reference to FIGS. 1 to 9, a first embodiment of the apparatus 102 for transferring heat from a heat source 104 to air when the apparatus 102 is connected to the heat source 104 according to the first aspect is schematically shown. With reference to FIGS. 1 and 2, in the shown embodiment, each heat source 104 is an electric or electronic component attached or mounted to a printed circuit board (PCB) 105. The electric or electronic component may be a transmitter, an optical transducer, a power amplifier or any other heat-generating component, or any other heat-generating electric or electronic component. However, it is to be understood that the heat source 104 in alternative embodiments may be a component not mounted to a PCB 105. In the embodiments shown, there are four heat sources 104. For example, the heat source 104 or heat sources 104, and for example also the PCB 105, may be part of a network access node for a wireless communication system. The network access node may comprise a base station.

The apparatus 102 includes a heat sink 106. The heat sink 106 includes a heat sink base 108 and a plurality of primary fins 110 connected to the heat sink base 108. Each primary fin 110 of the plurality of primary fins 110 may be connected to the heat sink base 108 by being attached to the heat sink base 108 or by being formed integrally with the heat sink base 108. The primary fins 110 are provided in a plurality of primary fin modules 111, or sections. Each primary fin module 111 includes a plurality of primary fins 110. When the apparatus 102 and heat sink 106 are installed, i.e., have been installed and are in an installed state, the plurality of primary fins 110 of the same module 111 are arranged side by side but with a space of air between two adjacent primary fins 110. In the embodiment shown, four primary fin modules 111 are provided. However, fewer fin modules 111 may be provided, for example even only one fin module 111, or more modules 111 may be provided. As shown in FIGS. 1 and 2, when the apparatus 102 and heat sink 106 are installed, the primary fin modules 111 are arranged or located one above the other.

With reference to FIGS. 1 and 2, in lateral directions, each primary fin 110 forms an angle of approximately 90 degrees with the heat sink base 108. However, in vertical directions 113, each primary fin 110 forms a non-perpendicular angle with the heat sink base 108. However, in alternative embodiments, in lateral directions each primary fin 110 may form a non-perpendicular angle with the heat sink base 108. Further, the heat sink 102 includes a heat sink front 112. In the shown embodiments, the heat sink front 112 is formed as a part or structure separate from the primary fins 110. However, the heat sink front is not necessarily a part or structure separate from the primary fins 110, but may simply be the region where the primary fins 110 end toward the front and may thus be formed by parts of the primary fins 110. Each primary fin 110 of the plurality of primary fins 110 may be connected to the heat sink front 112. Each primary fin 110 of the plurality of primary fins 110 may be connected to the heat sink front 112 by being attached to the heat sink front 112 or by being formed integrally with the heat sink front 112.

Figure 4:
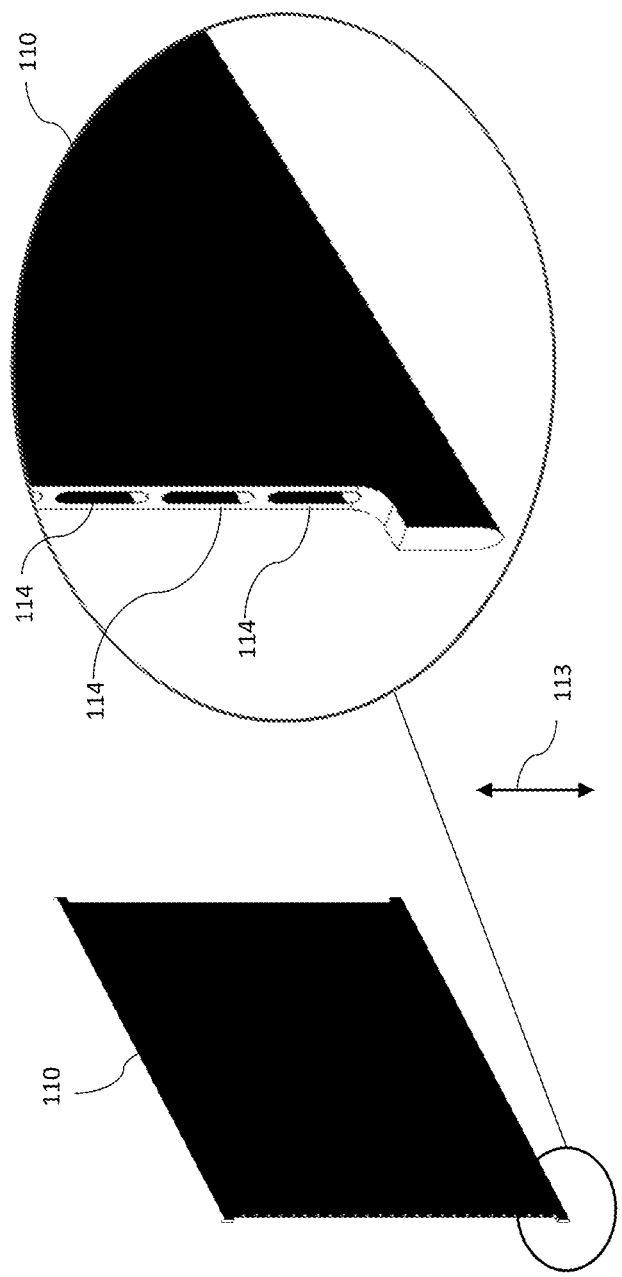
FIG. 4 is a schematic perspective view of a primary fin of the first embodiment of the apparatus of FIGS. 1-3, and an enlargement of a detail of the primary fin.

The heat sink base 108 is configured to be thermally coupled to the heat source 104 or sources 104. With reference to FIG. 4, each primary fin 110 of the plurality of primary fins 110 includes, or defines, one or more conduits 114, such as longitudinal hollows. In the embodiment shown, in lateral directions, each conduit 114 forms an angle of approximately 90 degrees with the heat sink base 108. However, in vertical directions 113, each conduit 114 forms a non-perpendicular angle with the heat sink base 108. Each primary fin 110 and associated conduits 114 may be formed by extrusion or by adjoining two plates. However, other ways of producing the primary fins 110 are possible. When the apparatus 102 and heat sink 106 are installed, the conduits 114 of the same primary fin 110 may be arranged or located one above the other.

Figure 5:
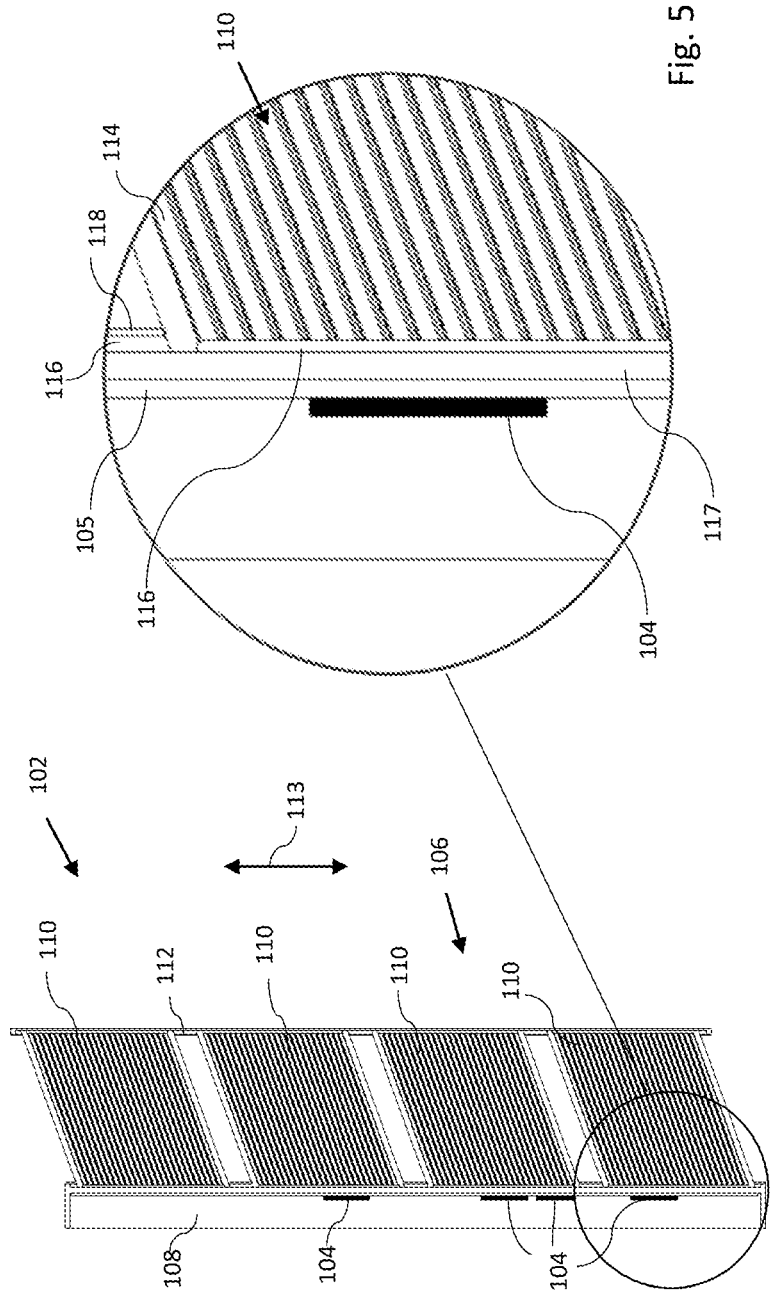
FIG. 5 is a schematic cross-sectional side view of the first embodiment of the apparatus of FIGS. 1 and 2, and an enlargement of a detail of the apparatus.

With reference to FIG. 5, the heat sink base 108 includes, or defines, a first chamber 116. The first chamber 116 and the conduits 114 together form, or define or constitute, a joint or common space sealed off from the ambient air surrounding the apparatus 102 and the heat sink 106. Thus, the first chamber 116 and the conduits 114 are parts of the common space. In other words, the plurality of primary fins 110 and the heat sink base 112 form or define the common space. The common space may be called an internal or physical space, for example a room, which forms an internal volume or common internal volume.

Further, the first chamber 116 and the conduits 114 together enclose, or contain or hold, a heat-carrying fluid in the common space formed by the first chamber 116 and the conduits 114. It is to be understood that the fluid can be a liquid or a vapour (gas) or a mixture thereof. As mentioned above, each conduit 114 is a hollow, for example integrated in the respective primary fin 110, for example an elongated hollow. Each conduit 114 can hold the fluid and may transport or convey the fluid along its length or longitudinal extension. By means of the fluid, heat is transferred away from the first chamber 116 via the conduits 114. The heat sink 106 may be called a liquid- and vapour-based heat sink 106.

The heat sink base 108 and/or the first chamber 116 may include one or more wick structures configured to be adjacent to a heat source 104. A wick structure per se is known to the skilled person and thus not further discussed in more detail. Each conduit 114 opens into the first chamber 116. The conduits 114 are fluidly connected to the first chamber 116. "Fluidly connected" in the context of the present disclosure and with regard to two entities, for example the conduit 114 and the first chamber 116, means that the two entities are in fluid communication with one another, i.e., that a fluid can travel from one of the entities to the other entity, for example, a fluid can travel between the conduit 114 and the first chamber 116.

Figure 3:
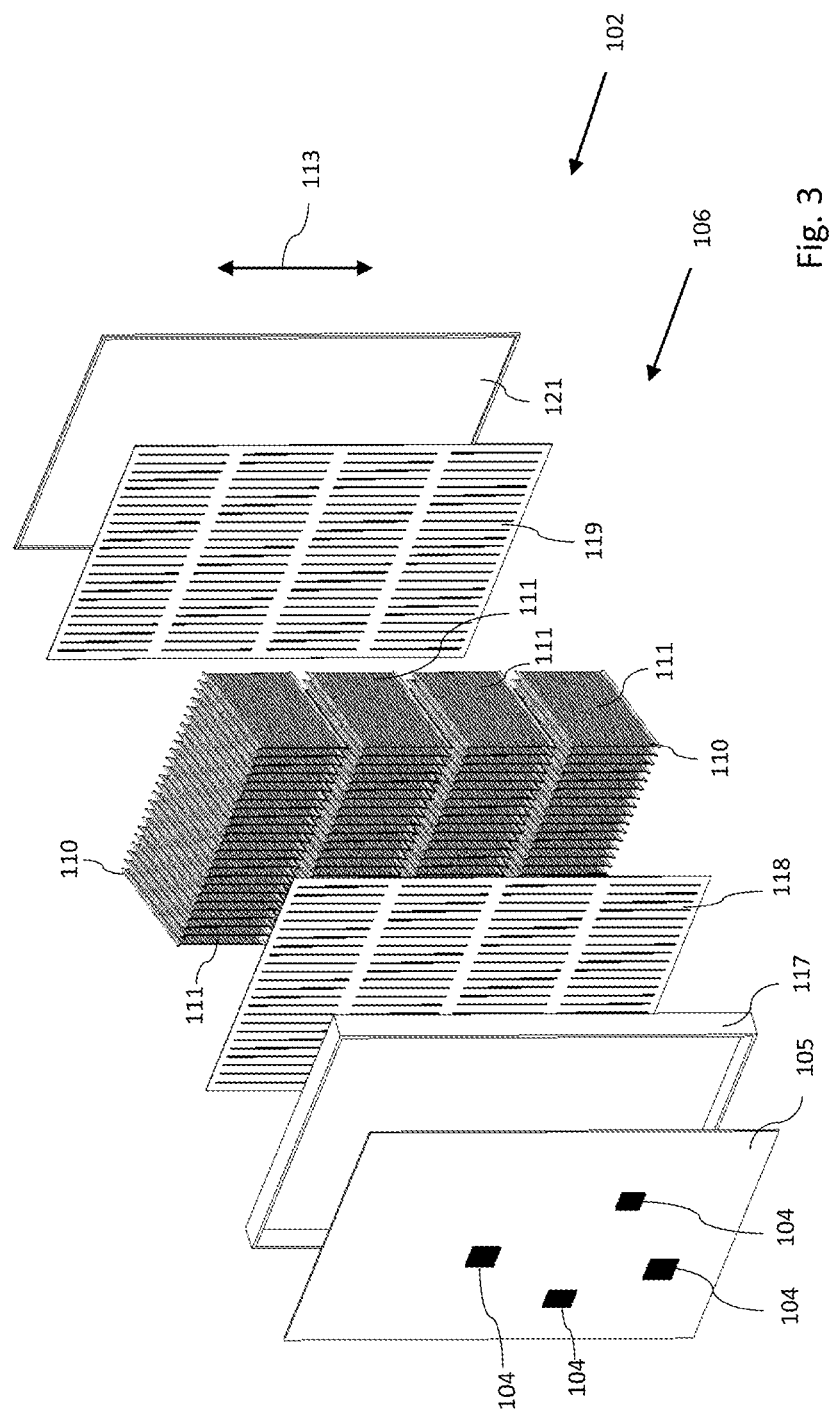
FIG. 3 is schematic exploded view of the first embodiment of the apparatus shown in FIGS. 1 and 2.

With reference to FIGS. 3 and 5, the heat sink base 108 includes a heat sink base plate 117 in contact with and/or adjacent to the heat sources 104 and/or the PCB 105. The heat sink base 108 also includes a heat sink base cover 118. The heat sink base cover 118 is provided with a plurality of openings or slots via which the conduits 114 of the primary fins 110 are fluidly connected to the first chamber 116. The heat sink base plate 117 is located between the heat sources 104 and the heat sink base cover 118. The heat sink base plate 117 is also located between the PCB 105 and the heat sink base cover 118.

The first chamber 116 and the conduits 114 form the common space such that heat is carried by the fluid from the first chamber 116 to the conduits 114. The first chamber 116 and the conduits 114 form the common space such that heat is carried by the fluid from the first chamber 116 to the heat sink front 112 via the conduits 114. This is illustrated by the arrows pointing upward and to the right in FIG. 7. The heat sink base 108 defines a hot interface, wherein the apparatus 102 at the hot interface is configured to turn a liquid of the fluid inside the common space into a vapour by allowing the liquid to absorb heat from the hot interface. In other words, the heat sink base 108 has a surface for turning a liquid of the fluid inside the common space, more specifically, inside the first chamber 116, into a vapour by allowing the liquid to absorb heat from said surface of the heat sink base 108 or from the heat sink base 108. The first chamber 116 has a shell 117, 118, for example formed by the heat sink base plate 117 and the heat sink base cover 118. The apparatus 102 at the hot interface, or at said surface, is configured to turn a liquid of the fluid inside the common space, more specifically, inside the first chamber 116, into a vapour by allowing the liquid to absorb heat from the shell 117, 118 of the first chamber 116. The first chamber 116 and the conduits 114 form the common space such that a vapour of the fluid travels from the first chamber 116 of the heat sink base 108, along the conduits 114 and toward the heat sink front 112. This is illustrated by the arrows pointing upward and to the right in FIG. 7.

Each primary fin 110 of the plurality of primary fins 110 may have a surface for condensing a vapour of the fluid inside the common space into a liquid. The first chamber 116 and the conduits 114 form the common space such that a liquid of the fluid is returned back to the first chamber 116 by way of any one of capillary action, gravity and pressure differences of the fluid. This is illustrated by the arrows pointing downward and to the left in FIG. 7. Thus, each conduit 114 can be described as a fluid-guiding hollow. Some conduits 114 are configured to guide fluid, for example vapour, from the heat sink base 108 to the heat sink front 112, whereas other conduits 114 are configured to guide fluid, for example condensed liquid, from the heat sink front 112 to the heat sink base 108. However, some conduits 114 may be configured to guide the fluid both from the heat sink base 108 to the heat sink front 112 and from the heat sink front 112 to the heat sink base 108.

Figure 6:
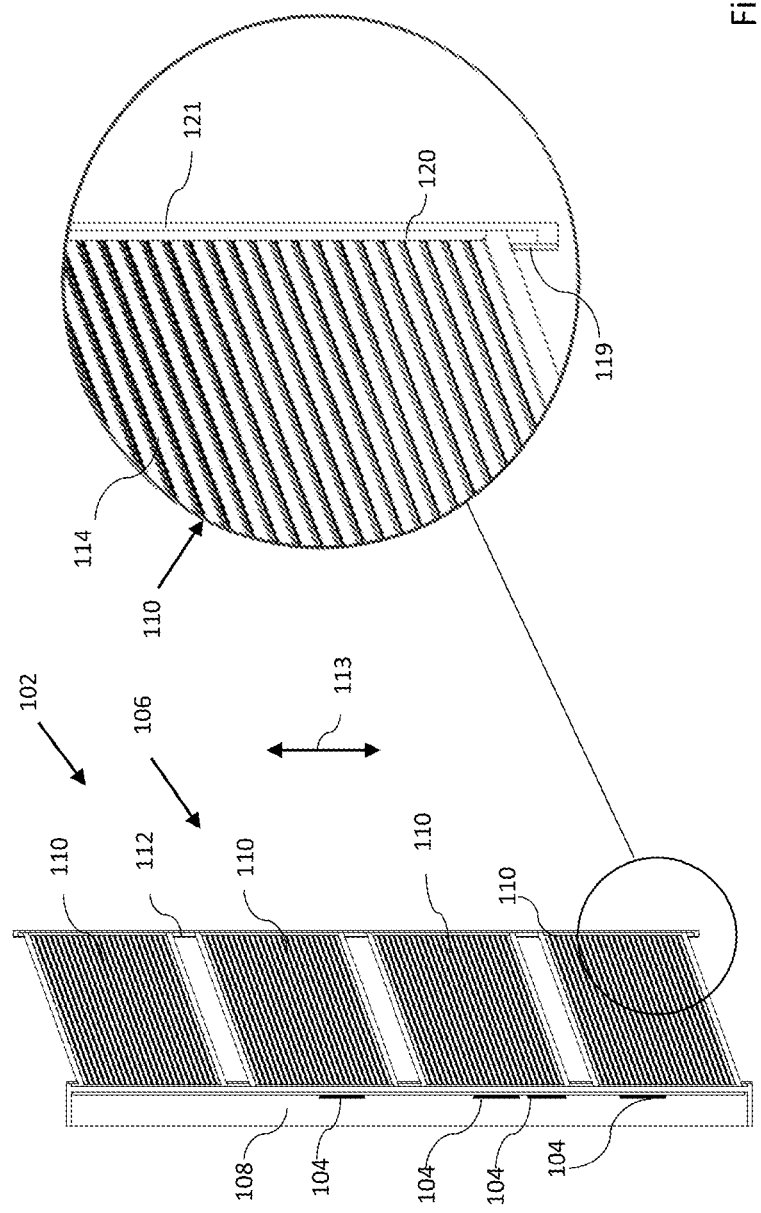
FIG. 6 is the same schematic cross-sectional side view of the first embodiment of the apparatus as in FIG. 5, but with a different enlargement of a detail of the apparatus.
Figure 7:
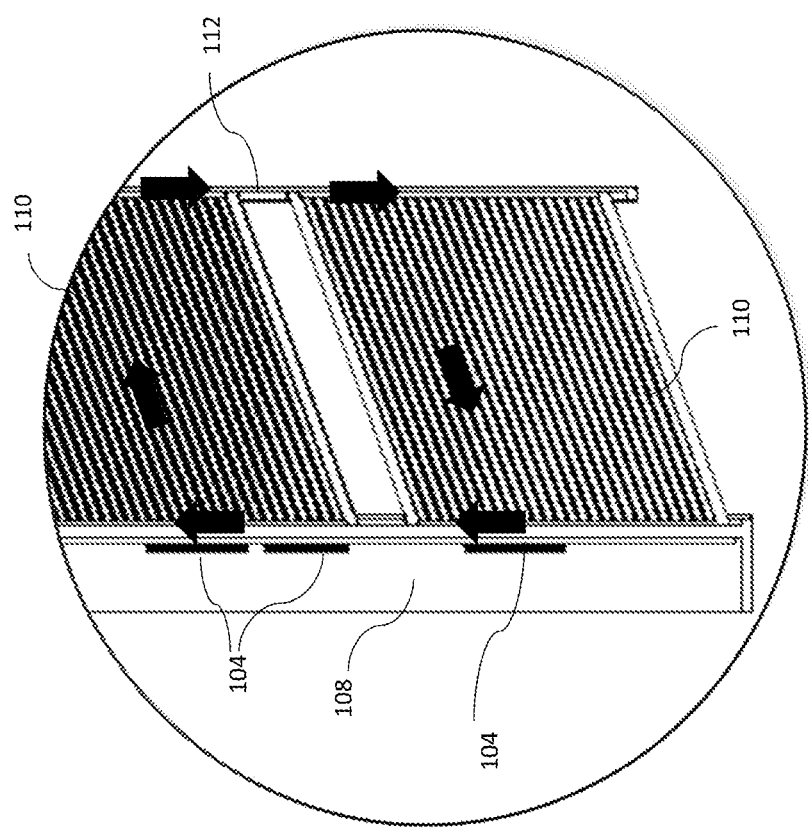
FIG. 7 is a schematic partial cross-sectional side view of the apparatus of FIGS. 1 and 2 illustrating the movement of the fluid in the common space.

With reference to FIGS. 3 and 6, the heat sink front 112 may comprise a heat sink front cover 119 and a heat sink front plate 121. In the shown embodiment, the heat sink cover 119 is located between the heat sink front plate 121 and the primary fins 110. The heat sink front 112 includes, or defines, a second chamber 120. The first chamber 116, the conduits 114 and the second chamber 120 together form a common space sealed off from the ambient air surrounding the apparatus 102, wherein the first chamber 116, the conduits 114 and the second chamber 120 together enclose a heat-carrying fluid in the common space formed by the first chamber 116, the conduits 114 and the second chamber 120. The conduits 114 are fluidly connected to the second chamber 120. Each conduit 114 may extend from the first chamber 116 to the second chamber 120. The second chamber 120 may have a shell 119, 121, for example formed by the heat sink front cover 119 and the heat sink front plate 121 of the heat sink front 112. The heat sink front cover 119 is provided with a plurality of openings or slots via which the conduits 114 of the primary fins 110 are fluidly connected to the second chamber 120. The second chamber 120 is fluidly connected to the first chamber 116 via the conduits 114. The heat sink front 112 may be called a condenser.

By the fluid, heat is transferred away from the first chamber 116 via the conduits 114 to the second chamber 112, for example by evaporating a liquid of the fluid into a vapour in the first chamber 116. The vapour may then travel through the conduits 114. When the fluid has released heat, for example by condensing a vapour of the fluid into a liquid, for example in the conduit 114 of the primary fin 110 and/or in the second chamber 120, the fluid in the form of a liquid is conveyed back to the first chamber 116 via the conduits 114. The first chamber 116, the conduits 114 and the second chamber 120 may form the common space such that an evaporated vapour of the fluid travels from the first chamber 116 to the second chamber 120 via the conduits 114. The heat sink front 112 has a surface for condensing a vapour of the fluid inside the common space, more particularly inside the second chamber 120, into a liquid. The first chamber 116, the conduits 114 and the second chamber 120 may form the common space such that a condensed liquid of the fluid travels from the second chamber 120 to the first chamber 116 via the conduits 114. The condensing of a vapour into a liquid, the movement of the liquid in the second chamber 120 and the movement of the liquid from the second chamber 120 to the first chamber 116 via the conduits 114 are illustrated by the arrows pointing downward and to the left in FIG. 7.

Figure 8:
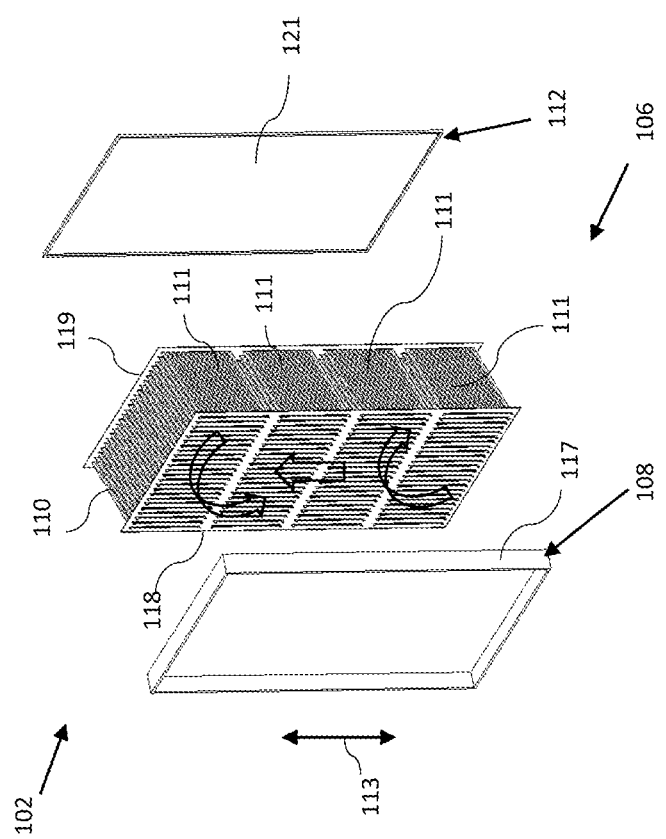
FIG. 8 is a schematic exploded view of the apparatus of FIGS. 1 and 2 illustrating the movement of the fluid on the heat sink base side.
Figure 9:
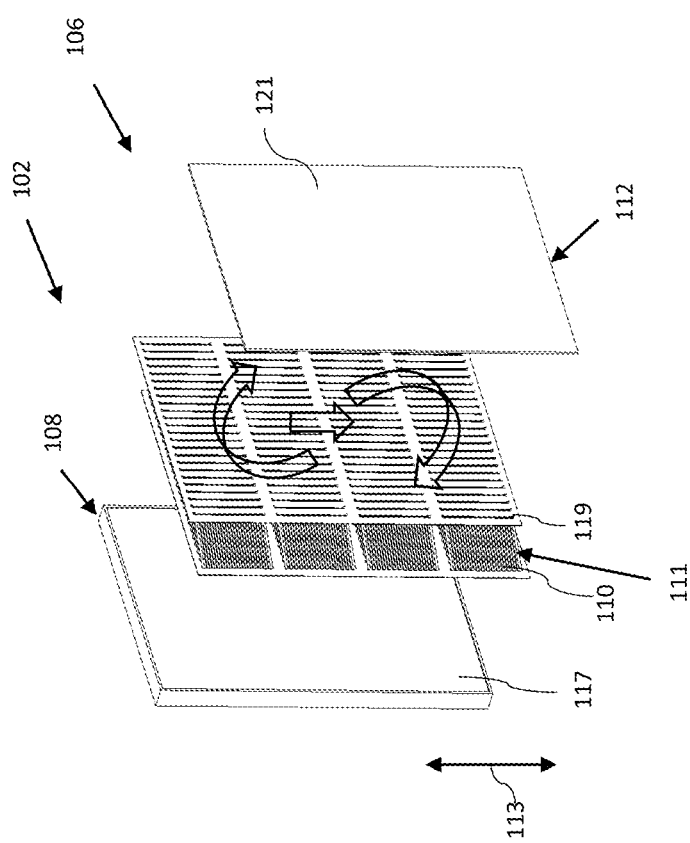
FIG. 9 is a schematic exploded view of the apparatus of FIGS. 1 and 2 illustrating the movement of the fluid on the heat sink front side.

In FIGS. 8 and 9, the movement of the fluid, in the form of vapour or liquid, at the heat sink base side and at the heat sink front side, respectively, is illustrated. With reference to FIGS. 1 to 9, when the apparatus 102 and heat sink 106 are installed, the heat sink base 108 and he heat sink front 112 may extend substantially in a vertical direction 113. When the apparatus 102 and heat sink 106 are installed, one or more of the first and second chambers 116, 120 may extend substantially in a vertical direction 113.

Figure 10:
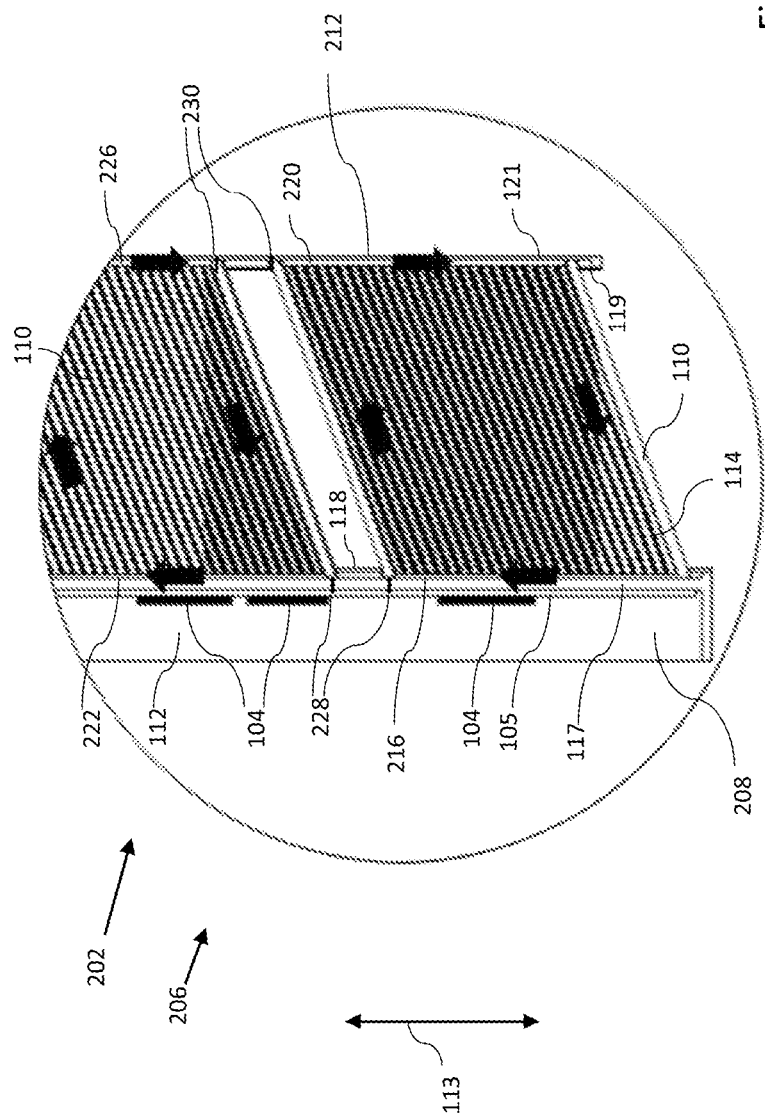
FIG. 10 is a schematic partial cross-sectional side view of a second embodiment of the apparatus according to the first aspect of the disclosure, which also illustrates the movement of the fluid.

With reference to FIG. 10, in a second embodiment of the apparatus 202 according to the first aspect, the heat sink front 212 of the heat sink 206 comprises, or defines, both a second chamber 220 and a fourth chamber 226. The heat sink base 208 comprises, or defines, both the first chamber 216 and a third chamber 222. The first chamber 216, the conduits 114 of each primary fin 110 of a first group of the plurality of primary fins 110 and the second chamber 220 together form a common space sealed off from the ambient air surrounding the apparatus 202. The first chamber 216, the conduits 114 of each primary fin 110 of the first group of the plurality of primary fins 110 and the second chamber 220 together enclose a heat-carrying fluid in the common space formed by the first chamber 216, the conduits 114 of each primary fin 110 of the first group of the plurality of primary fins 110 and the second chamber 220.

With reference to FIG. 10, the third chamber 222, the conduits 114 of each primary fin 110 of a second group of the plurality of primary fins 110 and the fourth chamber 226 together form a common space sealed off from the ambient air surrounding the apparatus 202. The third chamber 222, the conduits 114 of each primary fin 110 of the second group of the plurality of primary fins 110 and the fourth chamber 226 together enclose a heat-carrying fluid in the common space formed by the third chamber 222, the conduits 114 of each primary fin 110 of the second group of the plurality of primary fins 110 and the fourth chamber 226.

With reference to FIG. 10, at the heat sink base 208, the conduits 114 of each primary fin 110 of the first group of the plurality of primary fins 110 are fluidly connected to the first chamber 216 but sealed off (fluidly disconnected/separated) from the third chamber 222, wherein at the heat sink base 208 the conduits 114 of each primary fin 110 of the second group of the plurality of primary fins 110 are fluidly connected to the third chamber 222 but sealed off (fluidly disconnected/separated) from the first chamber 116. At the heat sink front 212 the conduits 114 of each primary fin 110 of the first group of the plurality of primary fins 110 are fluidly connected to the second chamber 220 but sealed off (fluidly disconnected/separated) from the fourth chamber 226, wherein at the heat sink front 212 the conduits 114 of each primary fin 110 of the second group of the plurality of primary fins 110 are fluidly connected to the fourth chamber 226 but sealed off (fluidly disconnected/separated) from the second chamber 220.

Figure 11:
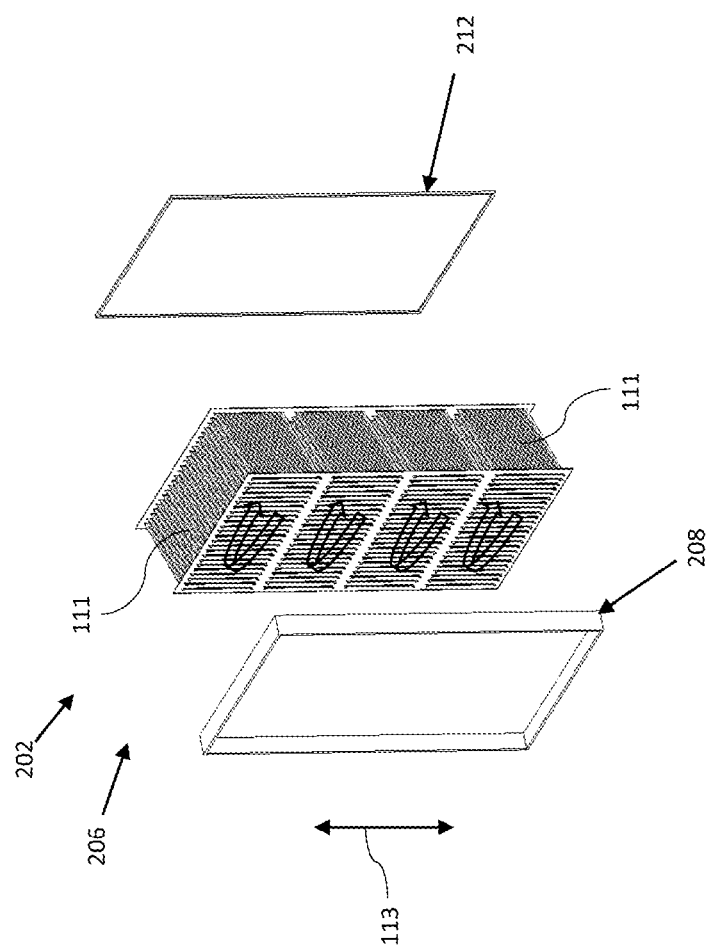
FIG. 11 is a schematic exploded view of the second embodiment of the apparatus of FIG. 10 illustrating the movement of the fluid on the heat sink base side.
Figure 12:
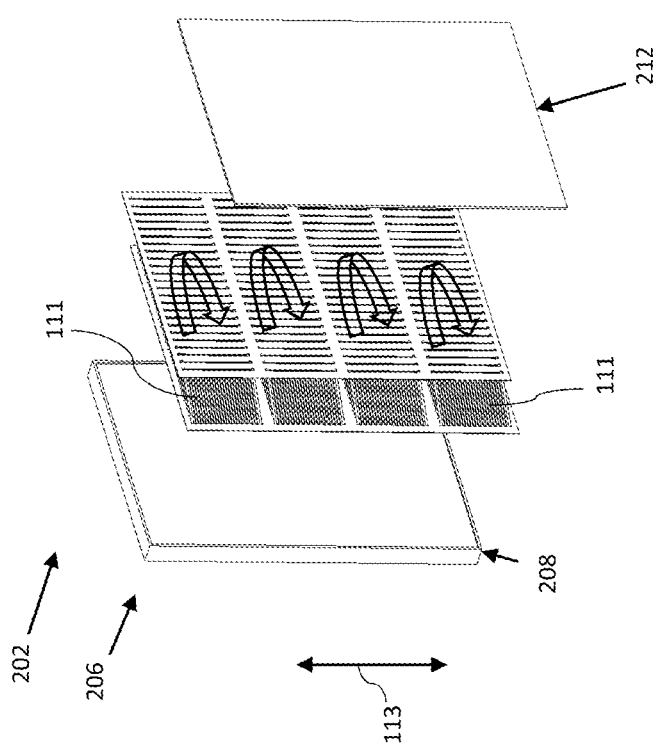
FIG. 12 is a schematic exploded view of the apparatus of FIG. 10 illustrating the movement of the fluid on the heat sink front side.

With reference to FIG. 10, at the heat sink base 208, the first and third chambers 216, 222 may be sealed off (fluidly disconnected) from one another by means of one or more first blocks 228. At the heat sink front 212, the third chamber 222 and the fourth chamber 226 may be sealed off (fluidly disconnected) from one another by means of one or more second blocks 230. The movement of the fluid with regard to the second embodiment is illustrated with arrows in FIG. 10. With reference to FIG. 10, the primary fins 110 shown can be described as belonging to two different modules or sections. In this manner, at the heat sink base 208, the conduits 114 are provided with and open into different evaporation chambers 216, 222 formed by the heat sink base 208 and the first and third chambers 216, 222, and at the heat sink front 212 the conduits 114 are provided with and open into different condensers, or condenser chambers, formed by the heat sink front 212 and the second and fourth chambers 220, 226. In FIGS. 11 and 12, the movement of the fluid, in the form of vapour or liquid, at the heat sink base side and at the heat sink front side, respectively, of the second embodiment of the apparatus 202 is illustrated. With reference to FIG. 10, when the apparatus 202 and heat sink 206 are installed, one or more of the first, second, third and fourth chambers 216, 220, 222, 226 may extend substantially in a vertical direction 113.

In an alternative embodiment, which is modified in relation to the first embodiment of the apparatus 102 shown in FIGS. 1 to 9 and in relation to the second embodiment of the apparatus 202 shown in FIGS. 10 to 12, the heat sink base 208 includes a third chamber 222, wherein the first chamber 216, the conduits 114 and the third chamber 222 together form a common space sealed off from the ambient air surrounding the apparatus. The first chamber 216, the conduits 114 and the third chamber 222 together enclose a heat-carrying fluid in the common space formed by the first chamber 216, the conduits 114 and the third chamber 222. At the heat sink base 208 the conduits 114 of each primary fin 110 of a first group of the plurality of primary fins 110 are fluidly connected to the first chamber 216 but sealed off from the third chamber 222, and wherein at the heat sink base 208 the conduits 114 of each primary fin 110 of a second group of the plurality of primary fins 110 are fluidly connected to the third chamber 222 but sealed off from the first chamber 216. Thus, at the heat sink base 208 the first and third chambers 216, 222 are sealed off from one another, and at the heat sink base 208 the conduits 114 open into different evaporation chambers 216, 222, which corresponds to the heat sink base 208 of the second embodiment of the apparatus 202 shown in FIGS. 10 to 12. However, at the heat sink front 112 the conduits 114 open into the same second chamber 120, which corresponds to the heat sink front 112 of the first embodiment of the apparatus 102 shown in FIGS. 1 to 9. Thus, at the heat sink front 112, the conduits 114 share a common condenser, or condenser chamber, formed by the heat sink front 112 and the second chamber 120.

Figure 13:
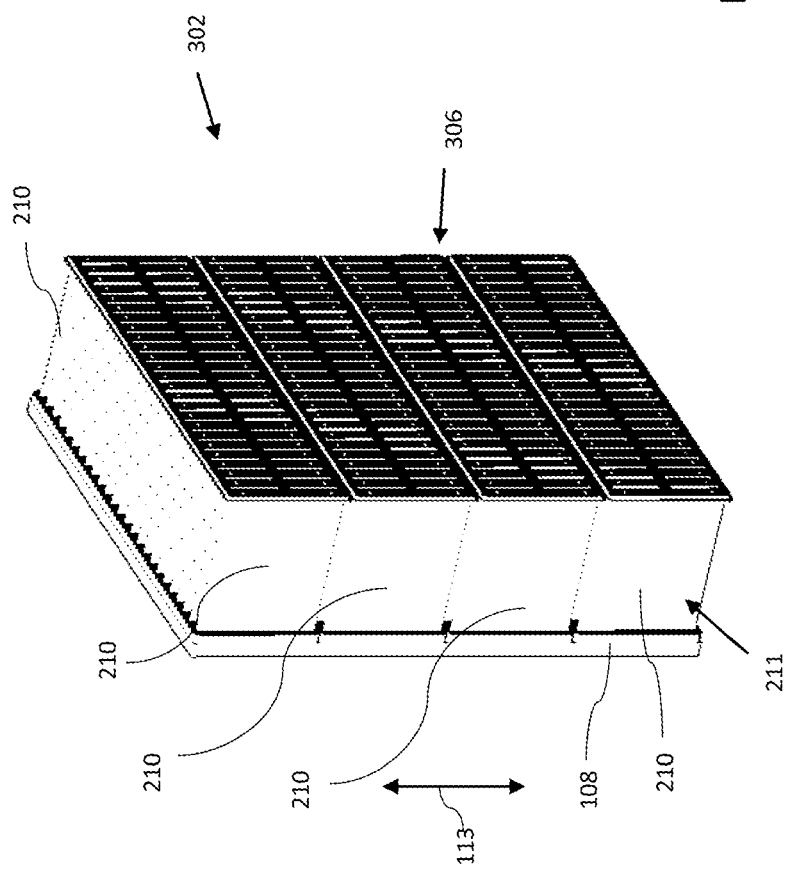
FIG. 13 is a schematic perspective view of a third embodiment of the apparatus according to the first aspect of the disclosure, with the heat sink front plate removed for illustrative purposes.
Figure 14:
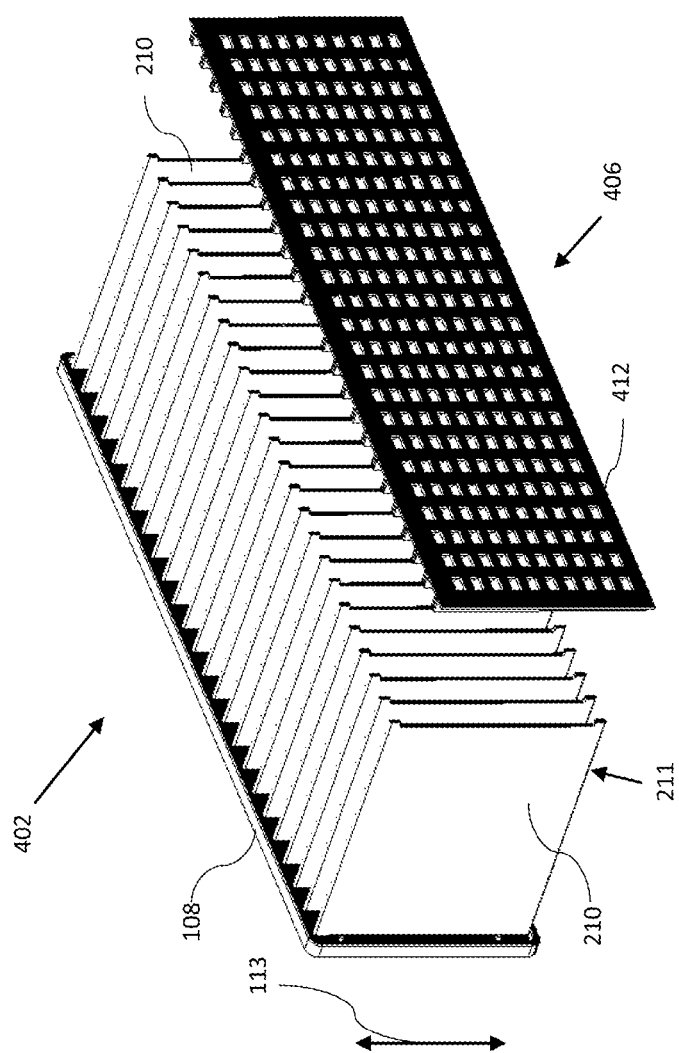
FIG. 14 is a partial schematic exploded view of a fourth embodiment of the apparatus according to the first aspect of the disclosure.
Figure 15:
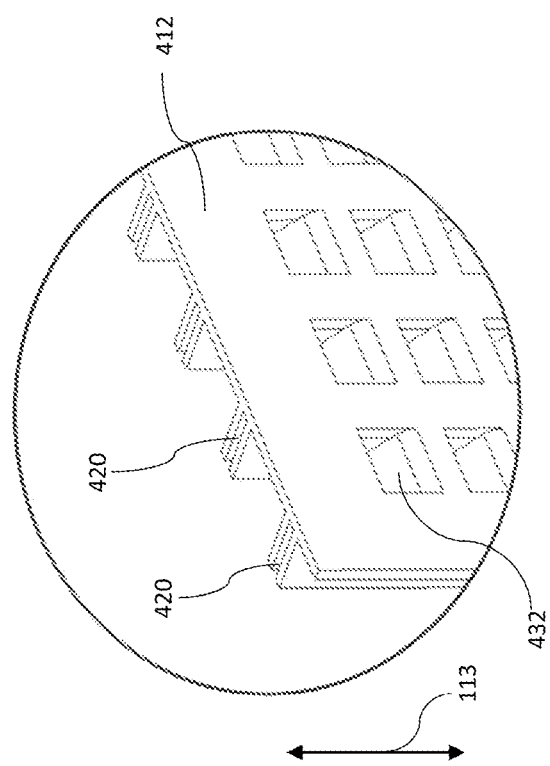
FIG. 15 is an enlargement of a detail of the apparatus of FIG. 14.
Figure 21:
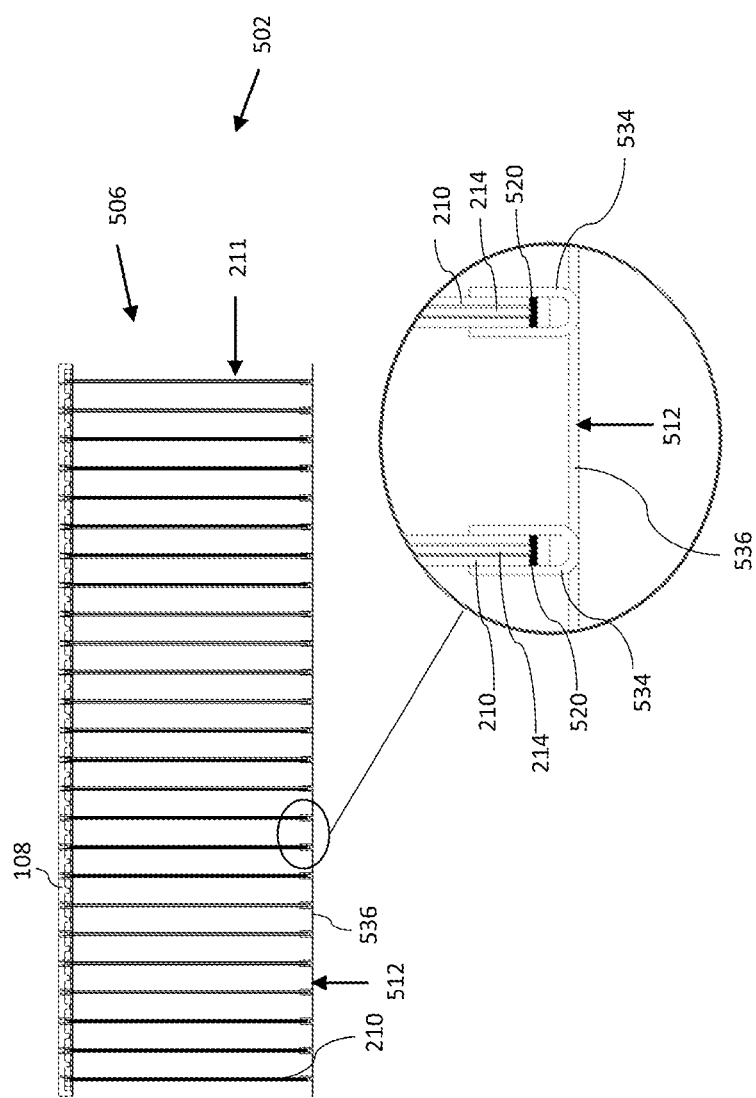
FIG. 21 is a schematic top view of the fifth embodiment of the apparatus of FIG. 18.

In FIG. 13, a part of a third embodiment of the apparatus 302 according to the first aspect of the disclosure is schematically illustrated. The apparatus 302 has four primary fin modules 211. Each primary fin module 211 includes a plurality of primary fins 210. In lateral directions, each primary fin 210 forms an angle of approximately 90 degrees with the heat sink base 108 of the heat sink 306, and also in vertical directions 113, each primary fin 210 forms an angle of approximately 90 degrees with the heat sink base 108. Thus, in the third embodiment of the apparatus 302, in lateral directions each conduit 214 (see FIGS. 16 and 21) may form an angle of approximately 90 degrees with the heat sink base 108, and also in vertical directions 113, each conduit 214 may form an angle of approximately 90 degrees with the heat sink base 108.

Figure 16:
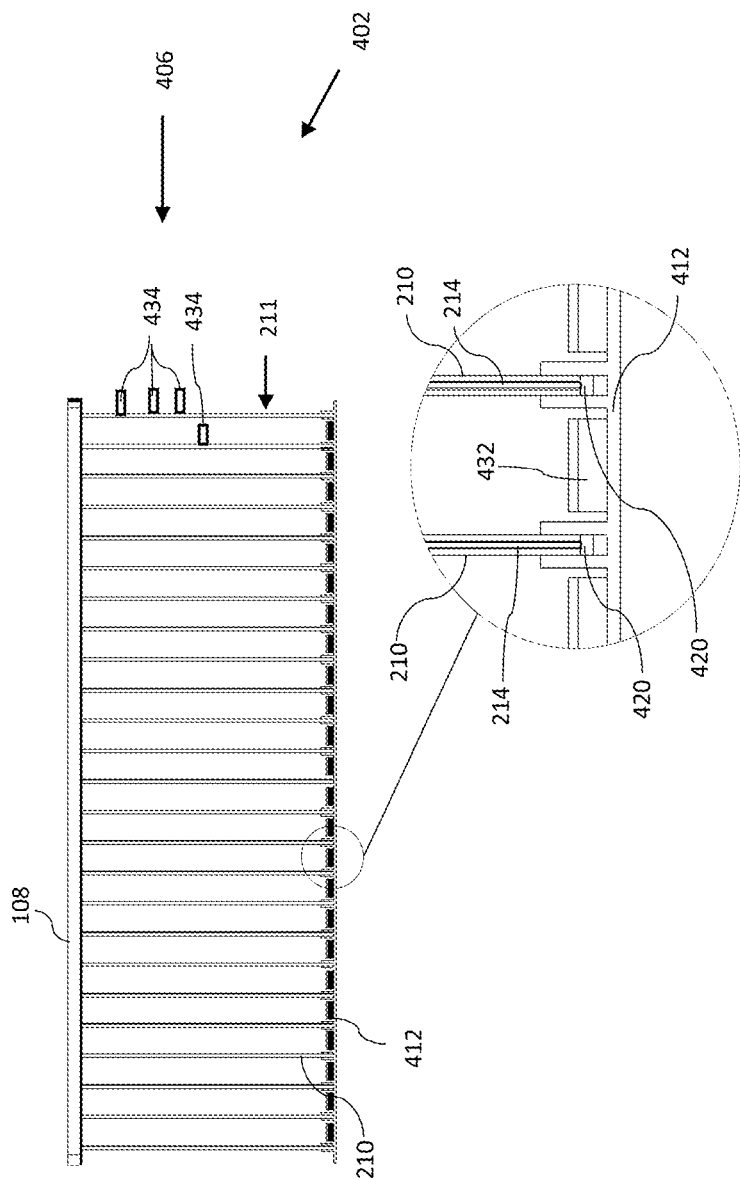
FIG. 16 is a top view of the apparatus of FIG. 14, and an enlargement of a detail of the apparatus.
Figure 17:
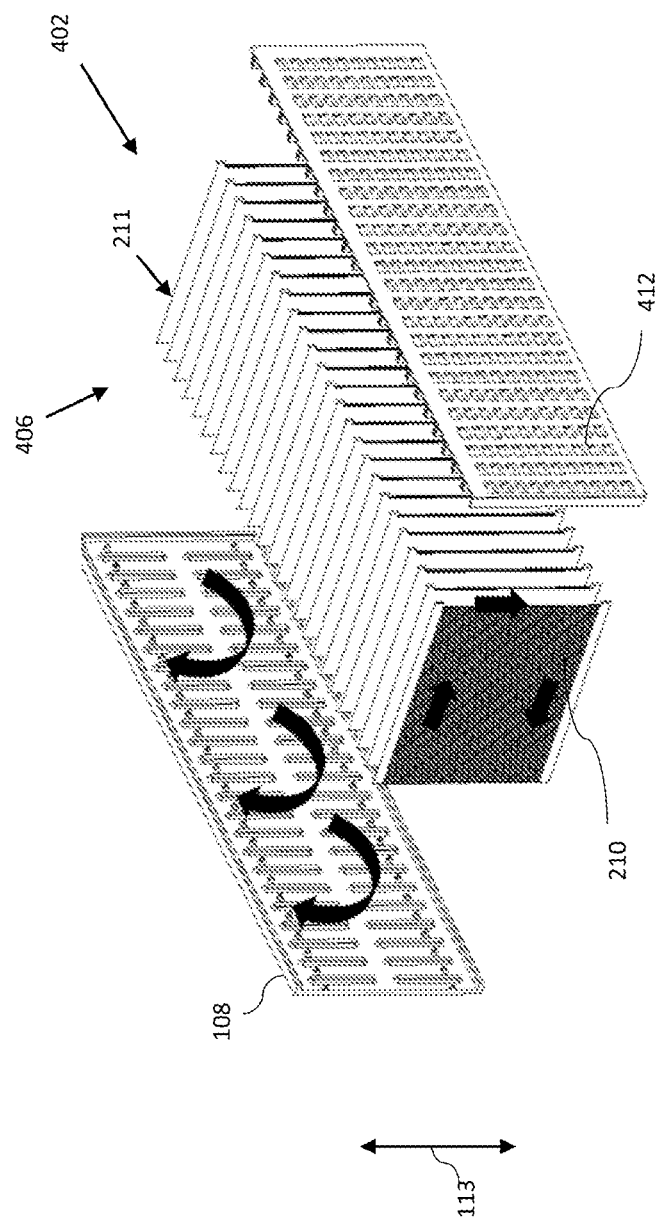
FIG. 17 is a partial schematic exploded view of the fourth embodiment of the apparatus of FIG. 14, illustrating the movement of the fluid.
Figure 18:
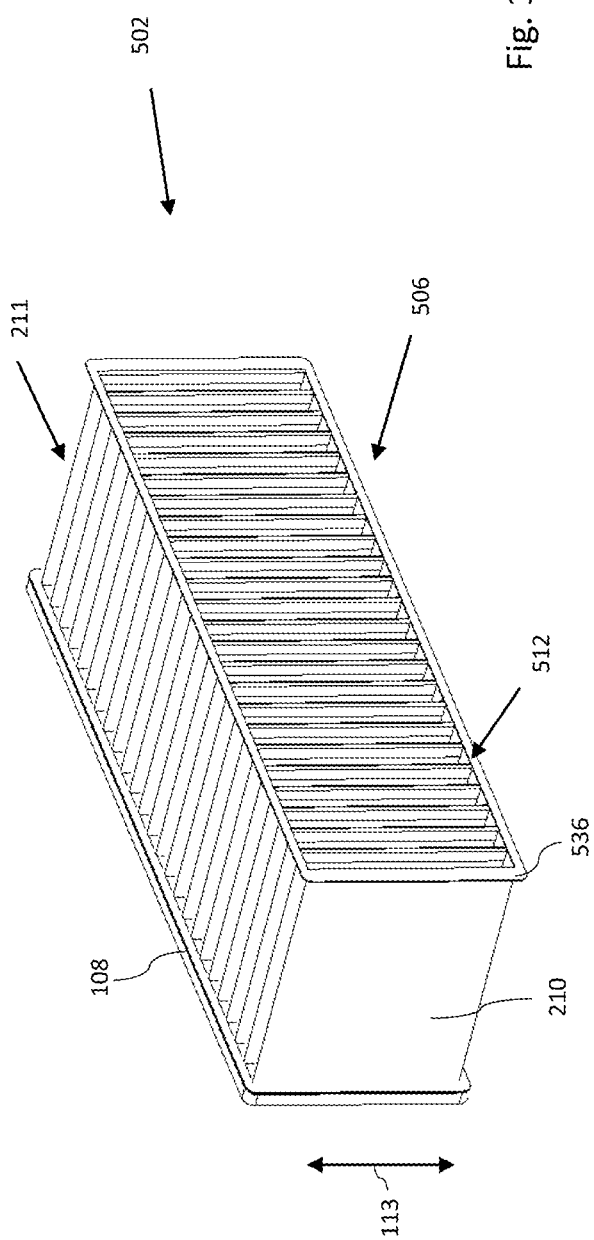
FIG. 18 is a partial schematic perspective view of a fifth embodiment of the apparatus according to the first aspect of the disclosure.
Figure 19:
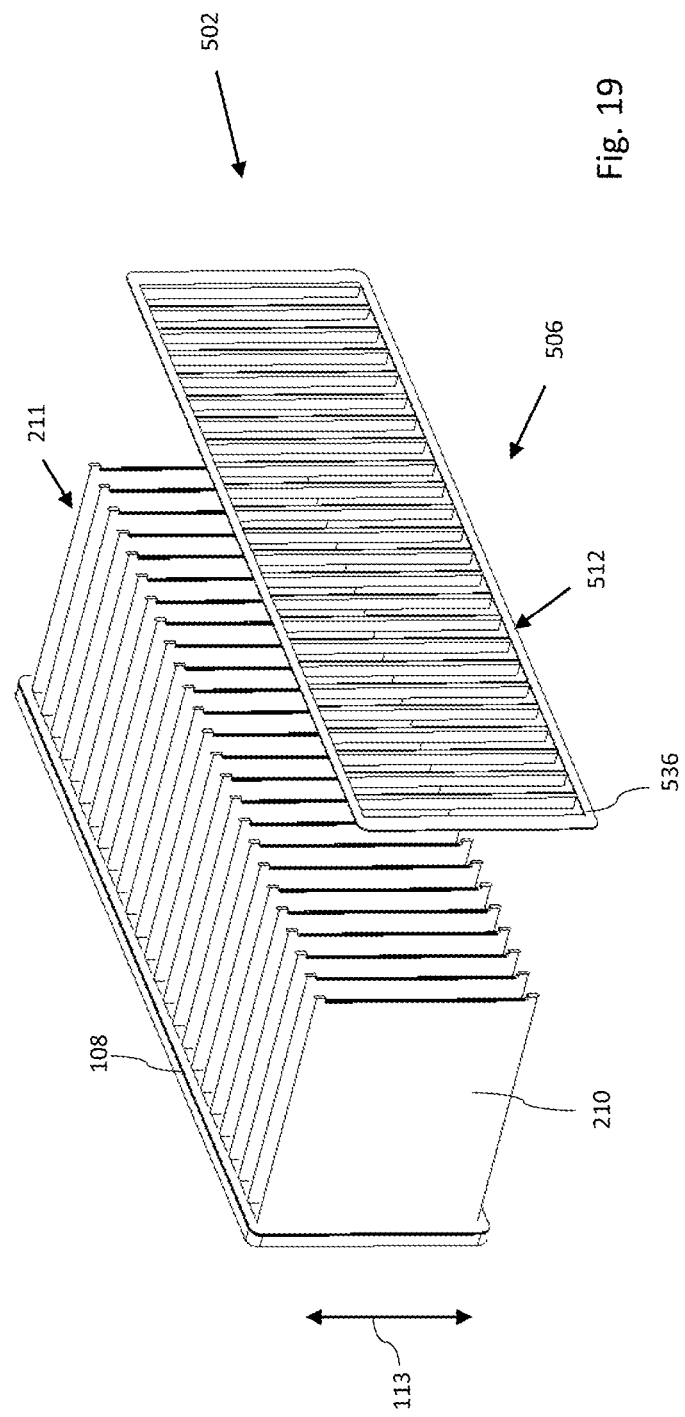
FIG. 19 is a schematic exploded view of the fifth embodiment of the apparatus of FIG. 18.
Figure 20:
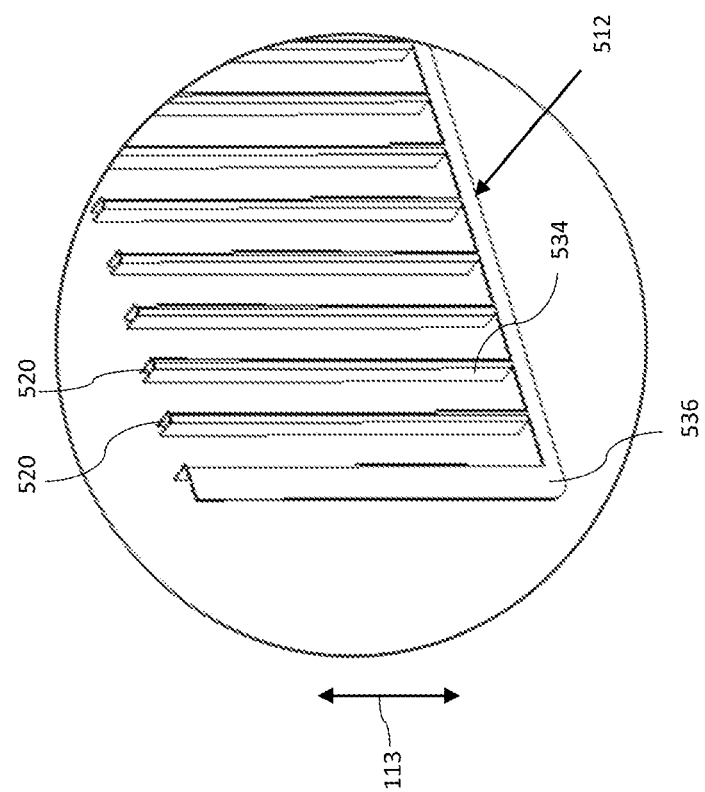
FIG. 20 is an enlargement of a detail of the apparatus of FIGS. 18 and 19.

With reference to FIGS. 14 to 17, a fourth embodiment of the apparatus 402 according to the first aspect is schematically illustrated. Only one section or module 211 of primary fins 210 is shown, but it is to be understood that the same features can apply to additional modules of primary fins 210. At the heat sink base 108, all primary fins 210 of the module may open into the same first chamber 116. However, at the heat sink front 412 the conduits 214 (see FIG. 16) of a first primary fin 210 of the plurality of primary fins 210 are sealed off from the conduits 214 of a second primary fin 210 of the plurality of primary fins 210. Thus, with reference to FIGS. 15 and 16, at the heat sink front 412 the conduits 214 of each primary fin 210 are provided with and open into their own individual condenser chamber 420 sealed off from the individual condenser chambers 420 of the conduits 214 of the other primary fins 210 of the module 211. The individual condenser chambers 420 extend substantially in a vertical direction 113 when the heat sink 406 and apparatus 402 are installed. At the heat sink front 412, between the individual condenser chambers 420, louvres 432, or tongues or flaps, may be provided to assist in the heat transfer from the heat sink front 412 to air. In FIG. 17, the movement of the fluid, in the form of vapour or liquid, at the heat sink base side and at the heat sink front side, respectively, of the fourth embodiment of the apparatus is illustrated.

With reference to FIG. 16, the apparatus 402 may comprise a plurality of secondary fins 434. Each secondary fin 434 of the plurality of secondary fins 434 is connected to a primary fin 210 of the plurality of primary fins 210. A plurality of secondary fins 434 may be connected to the same primary fin 210. In FIG. 16, only three secondary fins 434 connected to one primary fin 210 are shown. However, it is to be understood that more secondary fins 434 can be provided, which may be connected to one or more primary fins 210 of the plurality of primary fins 210. For example, secondary fins 434 may be located between two primary fins 210. Each secondary fin 434 of the plurality of secondary fins 434 may be connected to a primary fin 210 by being attached to, for example by welding, the primary fin 210 or by being formed integrally with the primary fin 210. However, it is to be understood that the secondary fins 434 may be excluded in alternative embodiments.

With reference to FIGS. 18 to 21, a fifth embodiment of the apparatus 502 according to the first aspect of the disclosure is schematically illustrated. Only one section or module 211 of primary fins 210 is shown, but it is to be understood that the same features can apply to additional modules 211 of primary fins 210. At the heat sink base 108, all primary fins 210 of the module may open into the same first chamber 116. However, with reference to FIGS. 20 and 21, at the heat sink front 512 the conduits 214 of a first primary fin 210 of the plurality of primary fins 210 are sealed off from the conduits 214 of a second primary fin 210 of the plurality of primary fins 210. Thus, with reference to FIGS. 20 to 21, at the heat sink front 512 the conduits 214 of each primary fin 210 are provided with and open into their own individual condenser chamber 520 sealed off from the individual condenser chambers 520 of the conduits 214 of the other primary fins 210 of the module 211. Each individual condenser chamber 520 may be formed by a U-shaped member 534. The U-shaped members 534 may be connected to a common frame 536. However, in an alternative embodiment, the common frame 536 may be excluded. When the heat sink 506 and apparatus 502 are installed, the individual condenser chambers 520 extend substantially in a vertical direction 113. At the heat sink front 512, between the individual condenser chambers 520, air is present. The movement of the fluid, in the form of vapour or liquid, at the heat sink base side and at the heat sink front side, respectively, of the fifth embodiment of the apparatus 502 corresponds to the movement illustrated in FIG. 17.

With reference to the embodiments disclosed above, each primary fin 110, 210 of the plurality of primary fins 110, 210 may extend from the heat sink base 108, 208 to the heat sink front 112, 212, 412, 512. The heat sink front 112, 212, 412, 512 may advantageously be located opposite the heat sink base 108, 208. With reference to the embodiments disclosed above, each primary fin 110, 210 of the plurality of primary fins 110, 210 may be connected to the heat sink front 112, 212, 412, 512. Each primary fin 110, 210 of the plurality of primary fins 110, 210 may be connected to the heat sink front 112, 212, 412, 512 by being attached to the heat sink front 112, 212, 412, 512, for example by being welded or attached by other mechanical means of attachment, or by being formed integrally with the heat sink front 112, 412, 512.

The parts or units of the heat sink 106 may be made of any suitable material, for example a heat-conducting material, such as any suitable metal or metal alloy, for example aluminium, copper etc. The amount or volume of the fluid in relation to the volume of the common space may be dependent on the locations of the heat sources to be cooled by the heat sink 106, 206, 306, 406, 506, for example such that a surface of a liquid of the fluid in the first chamber 116 is above the heat source 104 which is located vertically highest in relation to the other heat sources 104 when the heat sink 106, 206, 306, 406, 506 and apparatus 102, 202, 302, 402, 502 are installed, i.e., have been installed. The fluid may be water or a fluid known under the name R135A or R1233ZD, or any other suitable fluid. The first chamber 116 may include additional conduits, channels and/or partitions extending in various directions. The primary fins 110 do not have to be parallel to one another. When the apparatus 102, 202, 302, 402, 502 and heat sink 106, 206, 306, 406, 506 are installed, the heat sink base 108, 208 and the heat sink front 112, 212, 412, 512 may extend substantially in a vertical direction 113. When the apparatus 102, 202, 302, 402, 502 and heat sink 106, 206, 306, 406, 506 are installed, the conduit 114, 214 may extend substantially in a horizontal direction, or may form an angle with the horizontal plane. The heat sink 106, 206, 306, 406, 506 of the embodiments disclosed above may also be used in combination with one or more fans. The meaning of a "plurality" in the present disclosure or in the claims should be understood as two or more.

The embodiments of the present disclosure also comprise a network access node for a wireless communication system, wherein the network access node comprises an apparatus 102, 202, 302, 402, 502 according to any one of the embodiments disclosed above. The network access node herein may also be denoted as a radio network access node, an access network access node, an access point, or a base station, e.g., a Radio Base Station (RBS), which in some networks may be referred to as transmitter, "gNB", "gNodeB", "eNB", "eNodeB", "NodeB" or "B node", depending on the technology and terminology used. The radio network access nodes may be of different classes such as, e.g., macro eNodeB, home eNodeB or pico base station, based on transmission power and thereby also cell size. The radio network access node can be a Station (STA), which is any device that contains an IEEE 802.11-conformant Media Access Control (MAC) and Physical Layer (PHY) interface to the Wireless Medium (WM). The radio network access node may also be a base station corresponding to the fifth generation (5G) wireless systems. The network access node may include an active antenna, a remote radio unit (RRU) or a base band processor. The network access node may include one or more antennas. The network access node may have a housing, which houses the antenna. Alternatively, the antenna may be mounted outside the housing of the network access node, for example, with a distance to the housing of the network access node.

Finally, it should be understood that the disclosure is not limited to the embodiments described above, but also relates to and incorporates all embodiments within the scope of the appended independent claim.

The invention claimed is:

1. An apparatus for transferring heat from a heat source to air in a state where the apparatus is connected to the heat source, the apparatus comprising:
   a heat sink comprising a heat sink base and a plurality of primary fins connected to the heat sink base; and
   a heat sink front,
   wherein the heat sink base is configured to be thermally coupled to the heat source,
   wherein each primary fin of the plurality of primary fins comprises one or more conduits,
   wherein the heat sink base comprises a first chamber,
   wherein the first chamber and the one or more conduits together form a common space sealed off from the ambient air surrounding the apparatus,
   wherein the first chamber and the one or more conduits together enclose a heat-carrying fluid in the common space formed by the first chamber and the one or more conduits,
   wherein, at the heat sink front, the one or more conduits of a first primary fin of the plurality of primary fins are sealed off from the one or more conduits of a second primary fin of the plurality of primary fins,
   wherein the first primary fin opens into a first condenser chamber and the second primary fin opens into a second condenser chamber, and
   wherein flaps are provided between the first condenser chamber and the second condenser chamber.

2. The apparatus according to claim 1, wherein the first chamber and the one or more conduits form the common space such that the heat is carried by the fluid from the first chamber to the one or more conduits.

3. The apparatus according to claim 1, wherein the first chamber and the one or more conduits form the common space such that the heat is carried by the fluid from the first chamber to the heat sink front via the one or more conduits.

4. The apparatus according to claim 1, wherein the heat sink base defines a hot interface, and
   wherein the apparatus at the hot interface is configured to turn a liquid of the fluid inside the common space into a vapour by allowing the liquid to absorb the heat from the hot interface.

5. The apparatus according to claim 4, wherein the first chamber comprises a shell, and
   wherein the apparatus at the hot interface is configured to turn the liquid of the fluid inside the common space into the vapour by allowing the liquid to absorb the heat from the shell of the first chamber.

6. The apparatus according to claim 4, wherein the first chamber and the one or more conduits form the common space such that the vapour of the fluid travels from the first chamber of the heat sink base, along the one or more conduits and toward the heat sink front.

7. The apparatus according to claim 1, wherein each primary fin of the plurality of primary fins comprises a surface for condensing a vapour of the fluid inside the common space into a liquid.

8. The apparatus according to claim 7, wherein the first chamber and the one or more conduits form the common space such that the liquid of the fluid returns back to the first chamber by way of one of a capillary action, gravity and a pressure difference.

9. The apparatus according to claim 1, wherein the heat sink front comprises a second chamber,
   wherein the first chamber, the one or more conduits and the second chamber together form the common space sealed off from the ambient air surrounding the apparatus, and
   wherein the first chamber, the one or more conduits and the second chamber together enclose the heat-carrying fluid in the common space formed by the first chamber, the one or more conduits and the second chamber.

10. The apparatus according to claim 9, wherein the first chamber, the one or more conduits and the second chamber form the common space such that a vapour of the fluid travels from the first chamber to the second chamber via the one or more conduits.

11. The apparatus according to claim 9, wherein the heat sink front comprises a surface for condensing the vapour of the fluid inside the common space into a liquid.

12. The apparatus according to claim 1, wherein the heat sink base comprises a third chamber,
   wherein the first chamber, the one or more conduits and the third chamber together form the common space sealed off from the ambient air surrounding the apparatus,
   wherein the first chamber, the one or more conduits and the third chamber together enclose the heat-carrying fluid in the common space formed by the first chamber, the one or more conduits and the third chamber,
   wherein, at the heat sink base, the one or more conduits of each primary fin of a first group of the plurality of primary fins are fluidly connected to the first chamber but sealed off from the third chamber, and
   wherein, at the heat sink base, the one or more conduits of each primary fin of a second group of the plurality of primary fins are fluidly connected to the third chamber but sealed off from the first chamber.

13. The apparatus according to claim 1, wherein each primary fin of the plurality of primary fins extends from the heat sink base to the heat sink front.

14. A network access node for a wireless communication system, wherein the network access node comprises an apparatus for transferring heat from a heat source to ambient air while the apparatus is connected to the heat source, and wherein the apparatus comprises:
   a heat sink comprising a heat sink base and a plurality of primary fins connected to the heat sink base; and
   a heat sink front,
   wherein the heat sink base is configured to be thermally coupled to the heat source,
   wherein each primary fin of the plurality of primary fins comprises one or more conduits,
   wherein the heat sink base comprises a first chamber,
   wherein the first chamber and the one or more conduits together form a common space sealed off from the ambient air surrounding the apparatus,
   wherein the first chamber and the one or more conduits together enclose a heat-carrying fluid in the common space formed by the first chamber and the one or more conduits,
   wherein, at the heat sink front, the one or more conduits of a first primary fin of the plurality of primary fins are sealed off from the one or more conduits of a second primary fin of the plurality of primary fins,
   wherein the first primary fin opens into a first condenser chamber and the second primary fin opens into a second condenser chamber, and
   wherein flaps are provided between the first condenser chamber and the second condenser chamber.

15. The network access node according to claim 14, wherein the first chamber and the one or more conduits form the common space such that the heat is carried by the fluid from the first chamber to the one or more conduits.

16. The network access node according to claim 14, wherein the first chamber and the one or more conduits form the common space such that the heat is carried by the fluid from the first chamber to the heat sink front via the one or more conduits.

* * * * *